United States Patent
Knapp et al.

(10) Patent No.: US 10,759,539 B2
(45) Date of Patent: Sep. 1, 2020

(54) HEAT EXCHANGER FOR MITIGATING ICE FORMATION ON AN AIRCRAFT

(71) Applicant: Insitu, Inc. a subsidiary of The Boeing Company, Bingen, WA (US)

(72) Inventors: Jeffrey H. Knapp, Hood River, OR (US); Chad N. Blundell, White Salmon, WA (US); Mason A. Giovannoni, Trout Lake, WA (US)

(73) Assignee: The Boeing Company, Chicago, IL (US)

( * ) Notice: Subject to any disclaimer, the term of this patent is extended or adjusted under 35 U.S.C. 154(b) by 0 days.

(21) Appl. No.: 15/941,661

(22) Filed: Mar. 30, 2018

(65) Prior Publication Data
US 2019/0300182 A1 Oct. 3, 2019

(51) Int. Cl.
| | |
|---|---|
| *B64D 15/02* | (2006.01) |
| *F28F 3/12* | (2006.01) |
| *H01M 8/04007* | (2016.01) |
| *H01M 8/0267* | (2016.01) |
| *F02C 7/14* | (2006.01) |

(Continued)

(52) U.S. Cl.
CPC ............... *B64D 15/02* (2013.01); *F02C 7/14* (2013.01); *F28F 3/12* (2013.01); *H01M 8/0267* (2013.01); *H01M 8/04074* (2013.01); *H05K 7/2089* (2013.01); *F28D 2021/0021* (2013.01); *F28D 2021/0031* (2013.01); *F28F 2255/02* (2013.01); *H01M 2250/20* (2013.01)

(58) Field of Classification Search
CPC ...... B64D 13/006; B64D 15/02; B64D 15/04; B64D 15/166; F28F 3/12
See application file for complete search history.

(56) References Cited

U.S. PATENT DOCUMENTS

| | | | | |
|---|---|---|---|---|
| 1,715,202 A | * | 5/1929 | Lewis .................... | B64D 15/04 244/134 B |
| 1,932,681 A | * | 10/1933 | Smith .................... | B64D 15/04 244/134 B |

(Continued)

FOREIGN PATENT DOCUMENTS

| | | |
|---|---|---|
| EP | 0516280 | 12/1992 |
| EP | 3179074 | 6/2017 |
| EP | 3461743 | 4/2019 |

OTHER PUBLICATIONS

European Search Report concerning European Patent Application No. EP19165743.6 dated Sep. 3, 2019.

(Continued)

*Primary Examiner* — Joseph W Sanderson
(74) *Attorney, Agent, or Firm* — Kunzler Bean & Adamson

(57) ABSTRACT

A system comprises a heat source. The system also comprises a bladder comprising opposing thin-walled sheets and a fluid flow conduit defined between the opposing thin-walled sheets. The fluid flow conduit comprises an inlet and an outlet. The system further comprises a first fluid line coupled to the heat source and the inlet of the bladder. The system additionally comprises a second fluid line coupled to the heat source and the outlet of the bladder. The system also comprises fluid flowable through the first fluid line from the heat source to the inlet, from the inlet through the fluid flow conduit to the outlet, and through the second fluid line from the outlet to the heat source.

20 Claims, 12 Drawing Sheets

(51) Int. Cl.
*H05K 7/20* (2006.01)
*F28D 21/00* (2006.01)

(56) References Cited

U.S. PATENT DOCUMENTS

| | | | | |
|---|---|---|---|---|
| 2,035,019 A * | 3/1936 | Osborn | ................ | B64D 15/04 244/57 |
| 2,396,684 A * | 3/1946 | Chadsey | ................ | B64D 15/02 244/134 B |
| 2,470,128 A | 5/1949 | Barrick et al. | | |
| 2,553,218 A * | 5/1951 | Stuart | ................ | B64D 15/02 244/134 B |
| 3,094,301 A * | 6/1963 | Taylor | ................ | B64D 15/02 244/134 R |
| 4,505,445 A * | 3/1985 | Allison | ................ | B64D 15/02 244/134 B |
| 4,574,876 A * | 3/1986 | Aid | ................ | A61M 5/44 165/170 |
| 4,731,072 A * | 3/1988 | Aid | ................ | A61M 5/44 604/408 |
| 4,747,575 A * | 5/1988 | Putt | ................ | B64D 15/166 137/624.14 |
| 5,205,348 A * | 4/1993 | Tousignant | ................ | F28F 3/12 165/170 |
| 5,228,643 A | 7/1993 | Manda et al. | | |
| 5,966,502 A * | 10/1999 | Pearce | ................ | F28F 3/12 165/169 |
| 6,129,314 A * | 10/2000 | Giamati | ................ | B64D 15/00 244/134 A |
| 7,819,169 B2 * | 10/2010 | Pietraszkiewicz | ................ | F01D 5/147 164/132 |
| 8,172,156 B2 * | 5/2012 | Vafai | ................ | B82Y 30/00 165/46 |
| 8,444,093 B1 * | 5/2013 | Epstein | ................ | B64D 15/02 244/134 B |
| 8,702,039 B1 * | 4/2014 | Epstein | ................ | B64D 15/02 244/134 B |
| 8,857,767 B2 * | 10/2014 | Stolte | ................ | B64C 21/04 244/134 B |
| 9,887,437 B2 * | 2/2018 | Palanchon | ................ | F28F 3/12 |
| 2005/0065581 A1 | 3/2005 | Fletcher | | |
| 2006/0090886 A1 * | 5/2006 | Kamiyama | ................ | B60H 1/0055 165/140 |
| 2007/0104576 A1 * | 5/2007 | Cunha | ................ | B22C 9/04 416/97 R |
| 2009/0159238 A1 * | 6/2009 | Ko | ................ | A47G 9/0215 165/46 |
| 2010/0119885 A1 * | 5/2010 | Jayne | ................ | F28F 13/14 429/434 |
| 2011/0031353 A1 * | 2/2011 | Stolte | ................ | B64C 21/04 244/207 |
| 2011/0046821 A1 | 2/2011 | Grabowsky et al. | | |
| 2012/0185021 A1 | 7/2012 | Johnson | | |
| 2013/0199218 A1 | 8/2013 | Scheibert et al. | | |
| 2013/0260273 A1 | 10/2013 | Scheibert et al. | | |
| 2014/0017545 A1 | 1/2014 | Palanchon | | |
| 2015/0108233 A1 * | 4/2015 | Wright | ................ | B64D 13/08 237/12.3 R |
| 2016/0036104 A1 * | 2/2016 | Kenney | ................ | H01M 10/6556 429/120 |

OTHER PUBLICATIONS

European Search Report concerning European Patent Application No. EP19165743.6 dated Feb. 6, 2020.

* cited by examiner

HEAT EXCHANGER FOR MITIGATING ICE FORMATION ON AN AIRCRAFT

FIELD

This disclosure relates generally to an aircraft, and more particularly to dissipating heat from an aircraft and melting ice from a wing of the aircraft.

BACKGROUND

Some aircraft include components that generate significant levels of heat, which must be dissipated from the aircraft for sustained operation of the aircraft. However, conventional heat exchange systems for dissipating heat accomplish only a single objective. Moreover, conventional heat exchange systems can be large, heavy, inefficient, and aerodynamically inhibiting.

Under particular atmospheric conditions, ice tends to form on surfaces of aircraft, such as the leading edge of wings. Conventional methods exist for removing ice from and preventing buildup of ice on the surfaces of aircraft. However, such methods add an additional sub-system to the aircraft, which increases the weight, cost, power consumption, and complexity of the aircraft.

SUMMARY

The subject matter of the present application has been developed in response to the present state of the art, and in particular, in response to the shortcomings of heat exchange systems and ice-mitigation systems of aircraft that have not yet been fully solved by currently available techniques. Accordingly, the subject matter of the present application has been developed to provide a heat exchange system that concurrently dissipates heat and mitigates the formation of ice in a manner that overcomes at least some of the above-discussed shortcomings of prior art techniques.

Described herein is a system for dissipating heat. The system comprises a heat source. The system also comprises a bladder comprising opposing thin-walled sheets and a fluid flow conduit defined between the opposing thin-walled sheets. The fluid flow conduit comprises an inlet and an outlet. The system further comprises a first fluid line coupled to the heat source and the inlet of the bladder. The system additionally comprises a second fluid line coupled to the heat source and the outlet of the bladder. The system also comprises fluid flowable through the first fluid line from the heat source to the inlet, from the inlet through the fluid flow conduit to the outlet, and through the second fluid line from the outlet to the heat source. The preceding subject matter of this paragraph characterizes example 1 of the present disclosure.

A cross-sectional shape of the fluid flow conduit, along a plane perpendicular to a fluid flow direction through the fluid flow conduit, is elongated. The preceding subject matter of this paragraph characterizes example 2 of the present disclosure, wherein example 2 also includes the subject matter according to example 1, above.

Each sheet of the opposing thin-walled sheets is made of a metallic or plastic foil. The preceding subject matter of this paragraph characterizes example 3 of the present disclosure, wherein example 3 also includes the subject matter according to any one of examples 1 and 2, above.

The bladder further comprises a peripheral seal, about an outer periphery of the opposing thin-walled sheets, and at least one interior seal, only partially traversing the opposing thin-walled sheets interiorly of the peripheral seal. The peripheral seal and the at least one interior seal each comprises sealingly intercoupled portions of the opposing thin-walled sheets. The fluid flow conduit is defined between the peripheral seal and the at least one interior seal. The preceding subject matter of this paragraph characterizes example 4 of the present disclosure, wherein example 4 also includes the subject matter according to any one of examples 1-3, above.

The bladder further comprises a plurality of interior seals. The plurality of interior seals are arranged to change direction of the fluid flow conduit a plurality of times. The preceding subject matter of this paragraph characterizes example 5 of the present disclosure, wherein example 5 also includes the subject matter according to examples 4, above.

The system further comprises an inlet connection system and an outlet connection system. Each of the inlet connection system and the outlet connection system comprises a first fitting and a second fitting. The first fitting is selectively disconnectable from the second fitting. The first fitting of the inlet connection system is coupled to the bladder at the inlet and the second fitting of the inlet connection system is coupled to the first fluid line. The first fitting of the outlet connection system is coupled to the bladder at the outlet and the second fitting of the outlet connection system is coupled to the second fluid line. The preceding subject matter of this paragraph characterizes example 6 of the present disclosure, wherein example 6 also includes the subject matter according to any one of examples 1-5, above.

The heat source comprises a fuel cell stack. The preceding subject matter of this paragraph characterizes example 7 of the present disclosure, wherein example 7 also includes the subject matter according to any one of examples 1-6, above.

Further described herein is an aircraft. The aircraft comprises a body and wings. The wings are coupled to the body and each comprises a leading edge. The aircraft further comprises a heat source. The aircraft additionally comprises a heat exchanger at the leading edge of each of the wings. The aircraft also comprises a fluid transmission system coupled to the heat source and the heat exchanger. The fluid transmission system is operable to transfer fluid from the heat source to the heat exchanger and from the heat exchanger to the heat source. The preceding subject matter of this paragraph characterizes example 8 of the present disclosure.

The heat exchanger is elongated in a spanwise direction along the leading edge of the wing. The preceding subject matter of this paragraph characterizes example 9 of the present disclosure, wherein example 9 also includes the subject matter according to examples 8, above.

The heat exchanger is flexible. The preceding subject matter of this paragraph characterizes example 10 of the present disclosure, wherein example 10 also includes the subject matter according to any one of examples 8-9, above.

The heat exchanger is contoured to complement a contour of the leading edge of the wing. The preceding subject matter of this paragraph characterizes example 11 of the present disclosure, wherein example 11 also includes the subject matter according to any one of examples 8-10, above.

Each wing comprises an outer skin defining a profile of the wing. The outer skin comprises multiple layers. The heat exchanger is sandwiched between the multiple layers. The preceding subject matter of this paragraph characterizes example 12 of the present disclosure, wherein example 12 also includes the subject matter according to any one of examples 8-11, above.

The heat exchanger comprises a bladder comprising opposing thin-walled sheets and a fluid flow conduit defined between the opposing thin-walled sheets. The fluid flow conduit comprises an inlet and an outlet to which the fluid transmission system is coupled. The preceding subject matter of this paragraph characterizes example 13 of the present disclosure, wherein example 13 also includes the subject matter according to any one of examples 8-12, above.

The heat source is fixed to the body. The wings are selectively removable from the body. The fluid transmission system comprises a first fluid line and a second fluid line each fixedly coupled to the heat source. The fluid transmission system also comprises an inlet connection system and an outlet connection system each comprising a first fitting and a second fitting. The first fitting is selectively disconnectable from the second fitting. The first fitting is non-removably fixed to the heat exchanger. The second fitting is non-removably fixed to a corresponding one of the first fluid line and the second fluid line. The preceding subject matter of this paragraph characterizes example 14 of the present disclosure, wherein example 14 also includes the subject matter according to any one of examples 8-13, above.

The heat source comprises a fuel cell stack. The preceding subject matter of this paragraph characterizes example 15 of the present disclosure, wherein example 15 also includes the subject matter according to any one of examples 8-14, above.

The heat exchanger comprises a fluid flow conduit through which the fluid is flowable in a fluid flow direction. A cross-sectional shape, along a plane perpendicular to the fluid flow direction, of the fluid flow conduit is elongate. The preceding subject matter of this paragraph characterizes example 16 of the present disclosure, wherein example 16 also includes the subject matter according to any one of examples 8-15, above.

Each of the wings extends from an inboard end to an outboard end. Each heat exchanger comprises a bladder comprising at least one thin-walled sheet and defining a fluid flow conduit. The fluid transmission system comprises inner tubes, each comprising an inlet channel and each extending through the fluid flow conduit of a corresponding one of the bladders in a direction from the inboard end to the outboard end of a corresponding one of the wings. The fluid is transferred from the heat source to the fluid flow conduit of each bladder through the inlet channel of a corresponding one of the inner tubes. The preceding subject matter of this paragraph characterizes example 17 of the present disclosure, wherein example 17 also includes the subject matter according to any one of examples 8-16, above.

The fluid transmission system further comprises outer tubes each located at the inboard end of a corresponding one of the wings. Each outer tube is coaxial with a corresponding one of the inner tubes. Each outer tube defines an annular outlet channel, defined between the outer tube and a corresponding one of the inner tubes. The fluid is transferred from the fluid flow conduit of each bladder to the heat source through a corresponding one of the annular outlet channels. The preceding subject matter of this paragraph characterizes example 18 of the present disclosure, wherein example 18 also includes the subject matter according to example 17, above.

The fluid flow conduit of each bladder matches the entire cross-sectional area of a corresponding one of the wings from a top of the wing to a bottom of the wing. The preceding subject matter of this paragraph characterizes example 19 of the present disclosure, wherein example 19 also includes the subject matter according to any one of examples 17-18, above.

Further described herein is a method of mitigating ice formation on a wing of an aircraft. The method comprises transmitting a fluid through a heat source of the aircraft. The method also comprises transmitting the fluid from the heat source to an inlet of a heat exchanger located within and along the wing. The method further comprises transmitting the fluid through the heat exchanger from the inlet of the heat exchanger to an outlet of the heat exchanger. The method additionally comprises transmitting the fluid from the outlet of the heat exchanger to the heat source. The preceding subject matter of this paragraph characterizes example 20 of the present disclosure.

The described features, structures, advantages, and/or characteristics of the subject matter of the present disclosure may be combined in any suitable manner in one or more embodiments and/or implementations. In the following description, numerous specific details are provided to impart a thorough understanding of embodiments of the subject matter of the present disclosure. One skilled in the relevant art will recognize that the subject matter of the present disclosure may be practiced without one or more of the specific features, details, components, materials, and/or methods of a particular embodiment or implementation. In other instances, additional features and advantages may be recognized in certain embodiments and/or implementations that may not be present in all embodiments or implementations. Further, in some instances, well-known structures, materials, or operations are not shown or described in detail to avoid obscuring aspects of the subject matter of the present disclosure. The features and advantages of the subject matter of the present disclosure will become more fully apparent from the following description and appended claims, or may be learned by the practice of the subject matter as set forth hereinafter.

BRIEF DESCRIPTION OF THE DRAWINGS

In order that the advantages of the subject matter may be more readily understood, a more particular description of the subject matter briefly described above will be rendered by reference to specific embodiments that are illustrated in the appended drawings. Understanding that these drawings depict only typical embodiments of the subject matter and are not therefore to be considered to be limiting of its scope, the subject matter will be described and explained with additional specificity and detail through the use of the drawings, in which.

DETAILED DESCRIPTION

Reference throughout this specification to "one embodiment," "an embodiment," or similar language means that a particular feature, structure, or characteristic described in connection with the embodiment is included in at least one embodiment of the present disclosure. Appearances of the phrases "in one embodiment," "in an embodiment," and similar language throughout this specification may, but do not necessarily, all refer to the same embodiment. Similarly, the use of the term "implementation" means an implementation having a particular feature, structure, or characteristic described in connection with one or more embodiments of the present disclosure, however, absent an express correlation to indicate otherwise, an implementation may be associated with one or more embodiments.

Figure 1:
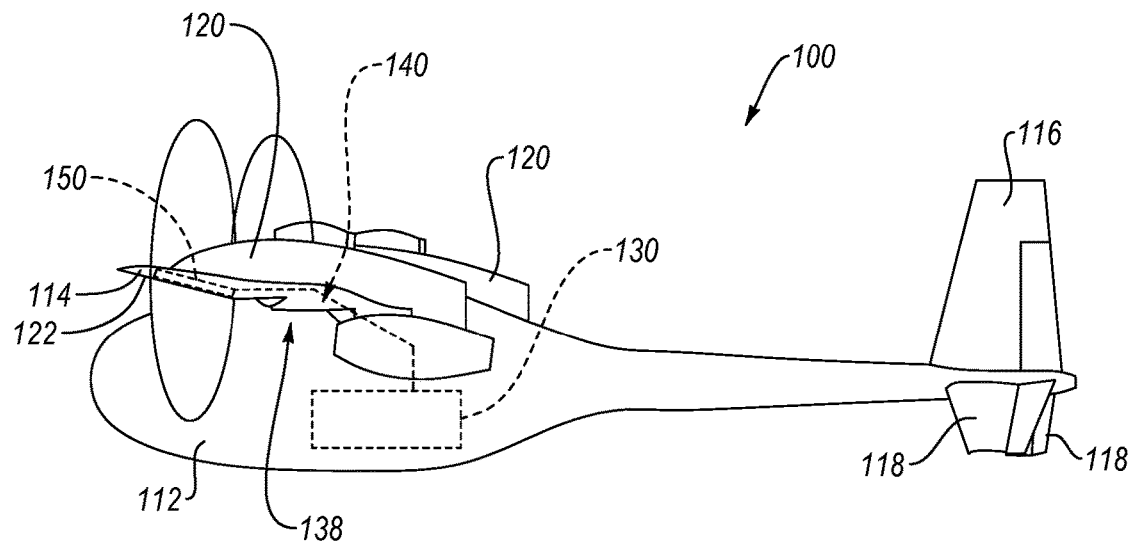
FIG. 1 is a side elevation view of an aircraft, according to one or more examples of the present disclosure.
Figure 2:
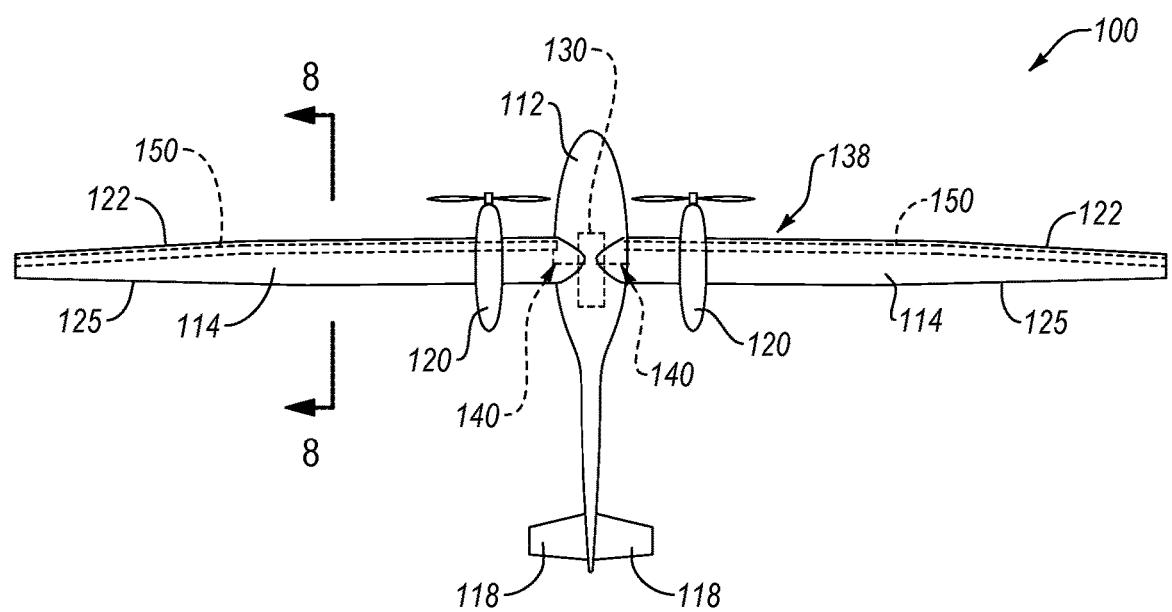
FIG. 2 is a top plan view of the aircraft of FIG. 1, according to one or more examples of the present disclosure.

Referring to FIGS. 1 and 2, one embodiment of an aircraft 100 is shown. The aircraft 100 can be any of various types of aircraft, such as commercial aircraft used for the transportation of passengers, military aircraft for military operations, personal aircraft, fighter jets, unmanned aircraft, and the like. Moreover, although an aircraft is depicted in the illustrated embodiments, in other embodiments, another structure, such as a vehicle (e.g., helicopter, boat, spacecraft, automobile, etc.) or a non-mobile complex structure (e.g., building, bridge, machinery, etc.), where dissipation of heat is desired can be used instead of an aircraft.

The aircraft 100 depicted in FIGS. 1 and 2 is an unmanned (e.g., pilotless) aircraft or unmanned aerial vehicle (UAV). The unmanned aerial vehicle can be a high-altitude, long-endurance (HALE) aircraft configured to fly at substantial heights and remain in flight for extended periods of time. According to some implementations, a UAV may fly at altitudes between about 60,000 feet and about 130,000 feet, and remain in flight without landing for days, weeks, and months. However, in other implementations, the UAV may be a low-altitude to medium-altitude aircraft.

Whether piloted or pilot-less, the aircraft 100 includes a body 112 (e.g., fuselage), a pair of wings 114 coupled to and extending from the body 112, a vertical stabilizer 116 coupled to the body 112, and a pair of horizontal stabilizers 118 coupled to the body 112 and/or the vertical stabilizer 116. Any of various parts of the aircraft 100 include a composite structure. For example, in some implementations, the body 112 of the aircraft 100 includes a composite panel that forms an outer skin of the body 112 of the aircraft 100. Like the body 112, the wings 114, the vertical stabilizer 116, and the horizontal stabilizers 118 can include a composite structure, such as composite outer skins. Alternatively, one or more of the body 112, the wings 114, the vertical stabilizer 116, or the horizontal stabilizers 118 can be made of a metallic material, such as aluminum.

Figure 8:
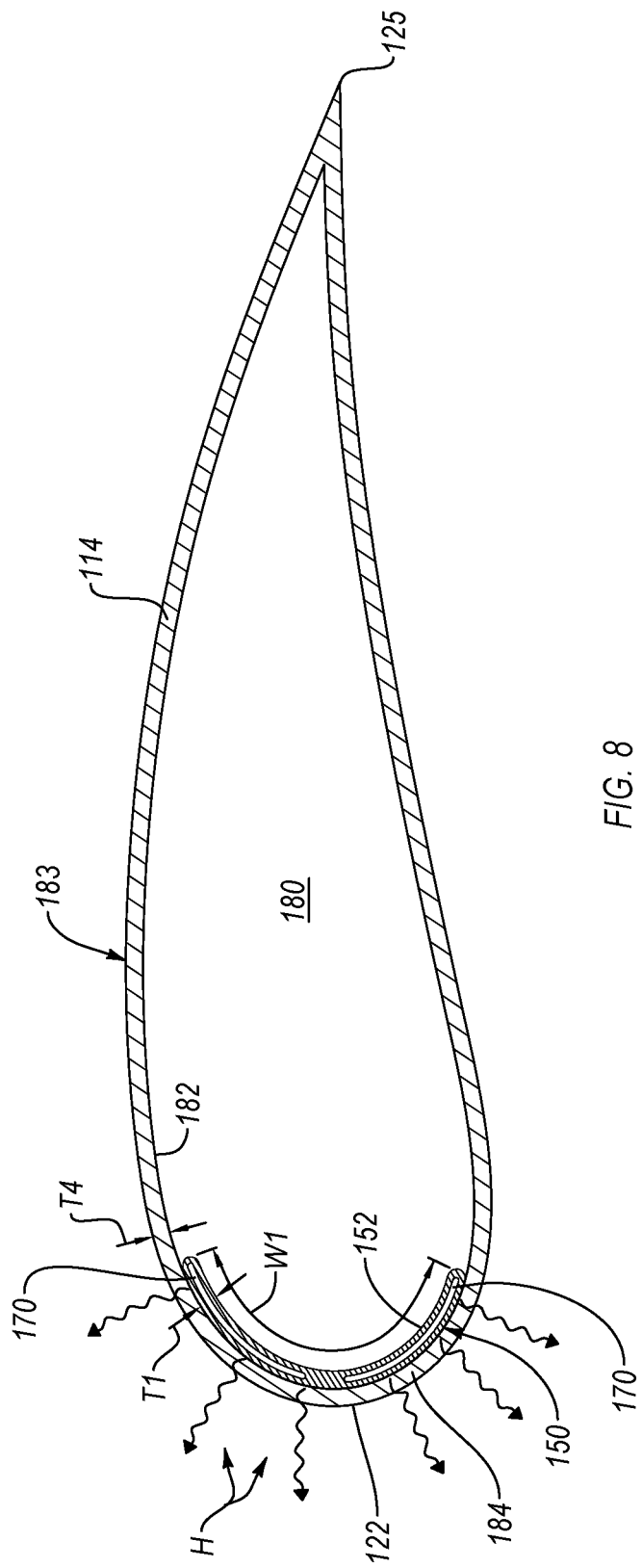
FIG. 8 is a cross-sectional side elevation view of a wing of the aircraft of FIG. 2, taken along the line 8-8 of FIG. 2, according to one or more examples of the present disclosure.
Figure 9:
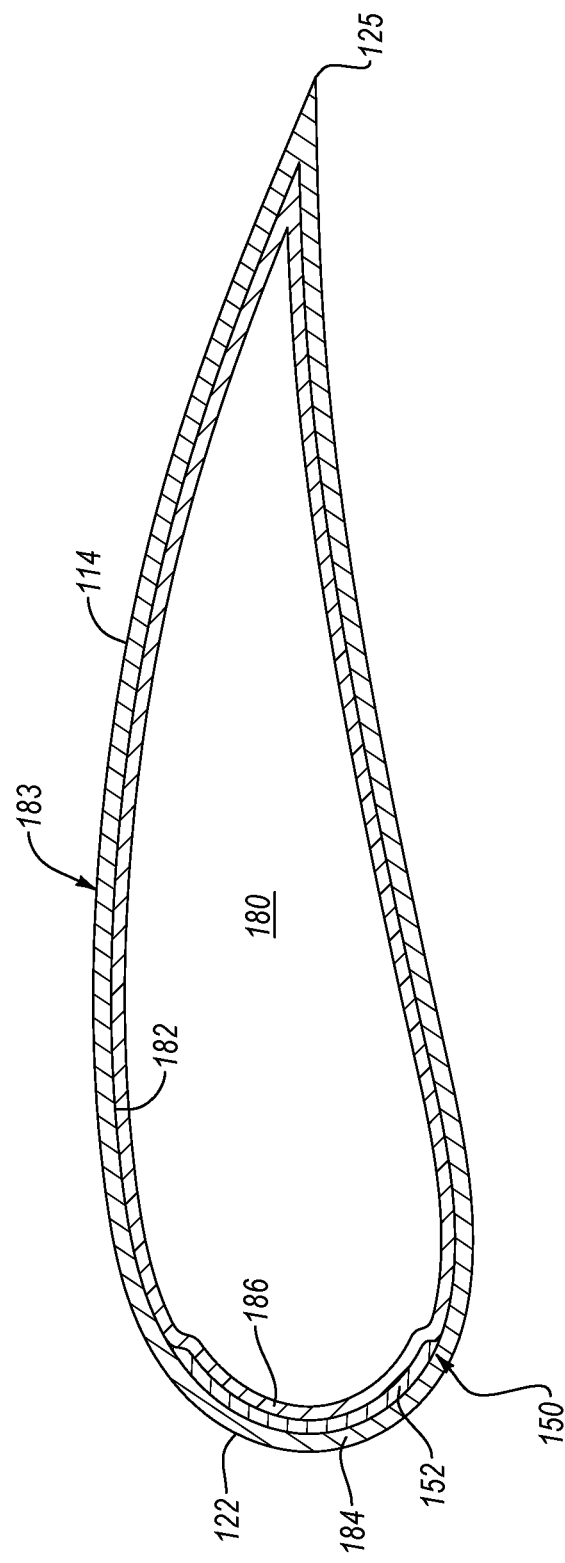
FIG. 9 is a cross-sectional side elevation view of a wing of the aircraft of FIG. 2, taken along the line 8-8 of FIG. 2, according to one or more examples of the present disclosure.

Referring to FIG. 8, each wing 114 of the aircraft 100 includes an outer skin 183 that defines a profile of the wing 114. The outer skin 183 is shaped such that the profile of the wing 114 is an airfoil conducive to inducing a lift force on the wing 114 in the presence of an airstream flowing around the wing 114. The outer skin 183 includes at least one layer 184. For example, in FIG. 8, the outer skin 183 includes one layer 184. In some implementations, as shown in FIG. 9, the outer skin 183 may include multiple layers, such as the layer 184 and a layer 186. The layer 184 and the layer 186 may be bonded together to form a laminate stack. Each of the layer 184 and the layer 186, whether alone or bonded to each other, may include multiple sub-layers. The sub-layers may include coatings, sealants, plies, adhesives, paint, insulators, and the like. For example, in one implementation, the layer 184 includes a plurality of plies. The plurality of plies are adhered or bonded to each other to form a laminated or multi-ply structure. Each ply of the plurality of plies is made of a fiber-reinforced polymer material, such as a carbon fiber reinforced polymer material, fiberglass, and the like. More specifically, each ply of the plurality of plies includes fibers embedded or suspended in a thermoset polymer matrix, such as a resin, epoxy, etc.

The outer skin 183 defines an interior cavity 180 of the wing 114. More specifically, the interior cavity 180 of the wing 114 is defined by an interior surface 182 of the layer 184. In the example of FIG. 9, the layer 186 is directly coupled to the interior surface 182 of the layer 184. Although not shown, the wing 114 may include additional structure within the interior cavity 180, such as spaced-apart spars extending spanwise along a length the wing 114.

Each wing 114 extends in a fore-to-aft or chordwise direction from a leading edge 122 to a trailing edge 125. The leading edge 122 is defined as the approximate portion of the wing 114 that first contacts the air during flight or is the foremost portion of the wing 114. Although conventionally the leading edge 122 can be considered to mean the foremost line along the wing 114, for purposes of this application, the leading edge 122 is considered to include the foremost line as well as portions of the outer surface of the wing 114 immediately adjacent the foremost line. For example, in one implementation, the leading edge 122 is considered to be any portion of the wing 114 on which ice is prone to accumulate during flight. As shown, the leading edge 122 of the wing 114 is a convex curved surface.

The aircraft 100 further includes a heat source 130. The heat source 130 can be any heat-generating element (e.g., component, device, system, apparatus, or the like) forming part of the aircraft 100. More particularly, in some implementations, the heat source 130 is any heat-generating element that generates waste heat of which dissipation from the aircraft is desired. The heat source 130 can be located on any portion of the aircraft 100. In the illustrated embodiment, the heat source 130 is located on the body 112, such as contained within the body 112.

Figure 4:
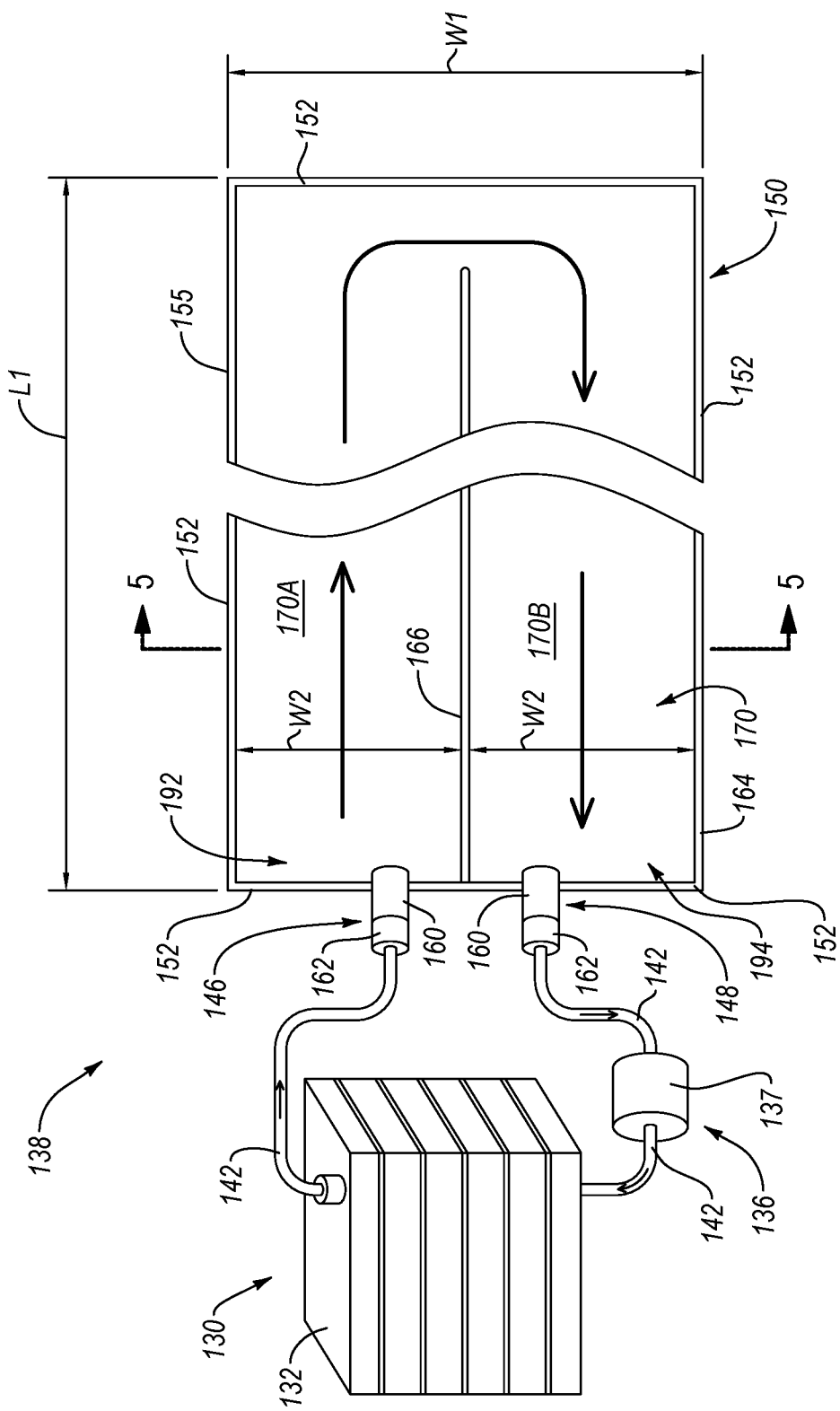
FIG. 4 is a part perspective view and part top plan view of a heat source and a heat exchange system, according to one or more examples of the present disclosure.

In some embodiments, the heat source 130 is an electrical or mechanical power-generating element. In one implementation, the heat source 130 is an engine, such as a jet or turbo-prop engine fueled by conventional aviation or diesel fuel or an alternative fuel. The combustion of the fuel produces heat in addition to mechanically driving a turbine, crankshaft, or other mechanical component. According to another implementation, the heat source 130 is a fuel cell system fueled by hydrogen. For example, as shown in FIG. 4, the heat source 130 is a solid-state fuel cell stack 132 that includes a plurality of proton exchange membrane (PEM) fuel cells. Electrical power is generated by the fuel cell stack 132 via a chemical reaction between oxygen, on a cathode side, and hydrogen, on an anode side, that produces electrical energy. Electrons then flow from the hydrogen side to the oxygen side through an electrical load. Because the chemical reaction is not perfectly efficient, in addition to producing electrical energy the chemical reaction also produces heat as a byproduct. Whether an engine or fuel cell stack 132, the produced waste heat can be significant enough that dissipation of the heat away from the aircraft 100 is necessary for sustained operation of the aircraft 100.

Electrical or mechanical power generated from such sources is used to drive thrust-producing jet engines, turboprop engines, and/or electrical motors in some implementations. In one particular implementation, the heat source 130 of the aircraft 100 is the fuel cell stack 132 and electrical power generated from the hydrogen-fueled fuel cells of the fuel cell stack 132 drive an electrical motor that rotates a propeller for generating thrust. Power generated by an aircraft 100 may also be used for any of various purposes other than to generate thrust. For example the aircraft 100 may have multiple sub-systems, such as flight control systems, landing gear systems, communication systems, and the like, which require mechanical or electrical power for operation.

It is also recognized that in some implementations, instead of a power-generating element, the heat source 130 is a power-consuming element, such as an electrical motor, computer hardware, heating and ventilation system, and the like. Accordingly, dissipation of waste heat, from a power-generating element and/or a power-consuming element, acting as the heat source 130, away from the aircraft 100 may be desired.

The aircraft 100 includes a heat exchange system 138 configured to dissipate waste heat generated by the heat source 130. The heat exchange system 138 includes a heat exchanger 150 and a fluid transmission system 140. The fluid transmission system 140 is coupled to and extends between the heat exchanger 150 and the heat source 130. Generally, the fluid transmission system 140 transfers heat, captured in fluid flowing through the transmission system 140, from the heat source 130 to the heat exchanger 150. Heat from the fluid is transferred to the heat exchanger 150 from which the heat is ultimately dissipated from the aircraft 100. More specifically, the heat exchanger 150 is coupled to a structural component 124 of the aircraft 100 and heat from the heat exchanger 150 is transferred to the structural component 124 from which the heat is dissipated from the aircraft via at least convective heat transfer. The convective heat transfer from the structural component 124 is facilitated by air moving over the structural component 124, such as during flight of the aircraft 100. In alternative embodiments, heat from the heat exchanger 150 is transferred from the heat exchanger 150 directly to ambient air, such as via a duct and fin design.

The structural component 124 can be any of various components of the aircraft 100 at least partially exposed to atmospheric air flow during flight. For example, the structural component 124 can be the body 112, the wings 114, the vertical stabilizer 116, and/or the horizontal stabilizers 118.

In one particular embodiment, the structural component 124 is a component of the aircraft 100 susceptible to ice formation. For example, the structural component 124 is a wing 114 in one embodiment. More specifically, the structural component 124 is the leading edge 122 of the wing 114 where the formation of ice during flight typically occurs. Accordingly, in such an embodiment, the heat exchanger 150 is coupled to the wing 114 and located at the leading edge 122 of the wing 114. For example, as shown in FIG. 2, the heat exchanger 130 is elongated in a spanwise direction along the leading edge 122 of the wing 114. Of course, because the aircraft 100 includes two wings 114, the heat exchange system 138 includes two fluid transmission systems 140 and two heat exchangers 150 each coupled to a corresponding one of the wings 114 at the leading edge 122 of the corresponding wing 114. However, for the sake of simplicity, and recognizing the description is applicable to both wings 114, unless otherwise noted, the heat exchange system 138 is described in terms of one fluid transmission system 140, one heat exchanger 150, and one wing 114.

Figure 5:
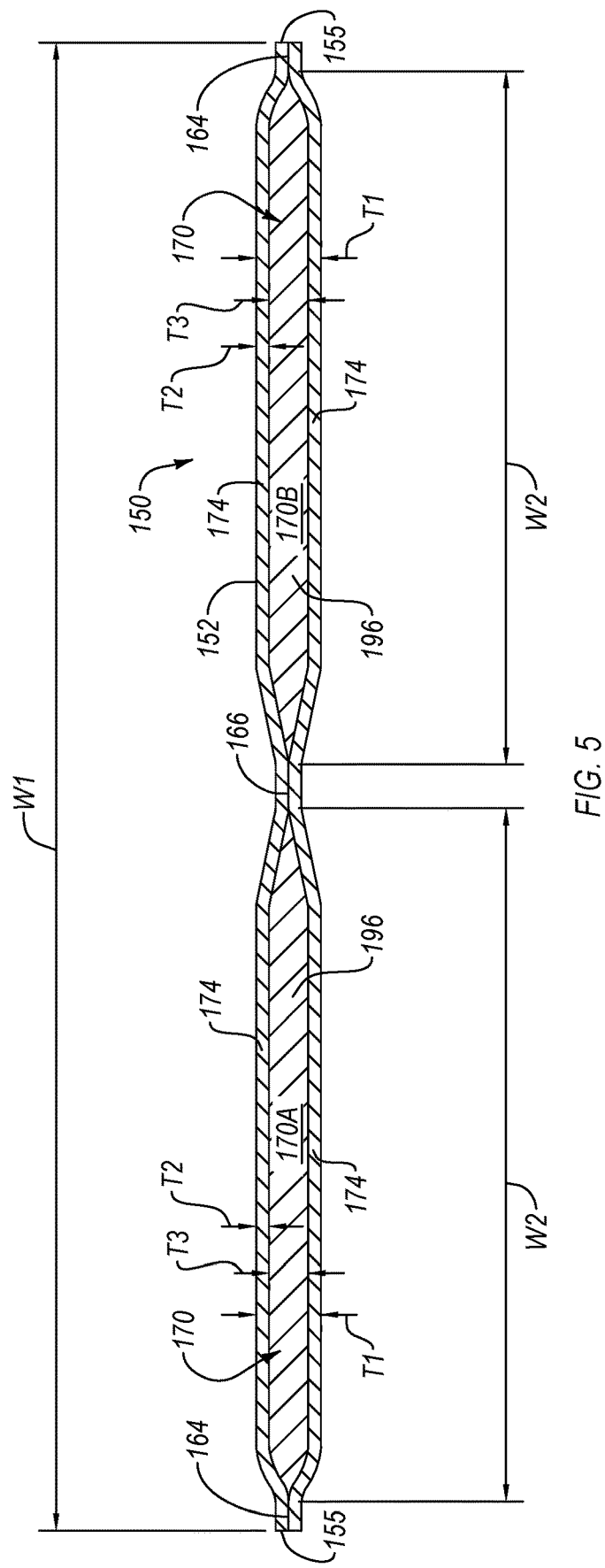
FIG. 5 is a cross-sectional side elevation view of a heat exchanger of the heat exchange system of FIG. 4, taken along the line 5-5 of FIG. 4, according to one or more examples of the present disclosure.

Referring to FIGS. 4 and 5, in one embodiment, the heat exchanger 150 is a bladder 152. The bladder 152 includes opposing thin-walled sheets 174 and a fluid flow conduit 170 defined between the opposing thin-walled sheets 174. The fluid flow conduit 170 includes an inlet 190 and an outlet 192. Fluid 196 flows in a fluid flow direction through the fluid flow conduit 170 from the inlet 190 to the outlet 192. The fluid 196 is supplied to the inlet 190 and released from the outlet 192 via the fluid transmission system 140 as explained in more detail below. The fluid 196 can be any of various coolants or heat transfer fluids. For example, the fluid 196 is water (e.g., deionized water) in some implementations. In other implementations, the fluid 196 is a liquid other than water, such as, for example, methyl alcohol, ethylene glycol, diethylene glycol, propylene glycol, polyalkylene glycol, nano-fluids, and the like.

The opposing thin-walled sheets 174 of the bladder 152 include a first sheet 174 forming one broad side of the bladder 152 and a second sheet 174, opposite the first sheet 174, forming an opposite broad side of the bladder 152. The opposing thin-walled sheets 174 in effect overlay each other so as to define a space or gap between the thin-walled sheets 174. Moreover, the outer peripheries of the opposing thin-walled sheets 174 define an outer periphery 155 of the bladder 152. The bladder 152 further includes a peripheral seal 164 extending about the outer periphery 155 of the bladder 152. The peripheral seal 164 retains the fluid 196 within the bladder 152, or more specifically, within the space defined between the opposing thin-walled sheets 174 of the bladder 152. In other words, the peripheral seal 164 prevents fluid 196 within the bladder 152 from exiting the bladder 152. The peripheral seal 164 includes sealingly intercoupled portions of the opposing thin-walled sheets 174 at the outer periphery of the thin-walled sheets 174. The thin-walled sheets 174 can be sealingly intercoupled to form the peripheral seal 164 in any of various ways. For example, in one implementation, the thin-walled sheets 174 are sealingly intercoupled by welding the thin-walled sheets 174 together. The weld between the sheets 174 (e.g., melding together of the sheets 174) acts as a fluidic barrier preventing the passage of fluid 196 through the weld. In other implementations, the thin-walled sheets 174 are sealingly intercoupled by a bonding or adhesive material via any of various bonding or adhesion techniques. Alternatively, in another implementation, a gasket and fasteners can be used to sealingly intercouple the thin-walled sheets 174.

The fluid flow conduit 170 of the bladder 152 includes multiple channels in some implementations or a single channel in other embodiments. For example, as shown in FIG. 4, the fluid flow conduit 170 includes a first channel 170A that directs fluid 196 in a first direction away from the inlet 190 and a second channel 170B that directs fluid 196 in a second direction, opposite the first direction, toward the outlet 192. The first channel 170A can be considered an outgoing channel and the second channel 170B can be considered a return channel. A bend in the fluid flow conduit 170 helps to redirect the fluid 196 from the first channel 170A into the second channel 170B (i.e., reverse the direction of flow of the fluid 196). The fluid flow conduit 170 is divided into channels via one or more interior seals 166. Like the peripheral seal 164, each interior seal 166 includes sealingly intercoupled portions of the opposing thin-walled sheets 174. However, the interior seal 166 does not extend about an outer periphery of the bladder 152, but rather only partially traverses the opposing thin-walled sheets 174 interiorly of the peripheral seal 164. For example, an interior seal 166 can extend from the peripheral seal 164 at one side of the bladder 152 to a location short of the opposing side of the bladder 152 such that a gap is defined between an end of the interior seal 166 and the peripheral seal 164. In other words, in the implementation shown in FIGS. 4 and 6, the interior seal 166 does not extend an entire length L1 of the bladder 152, but instead terminates short of the peripheral seal 164 on the opposing side of the bladder 152. This gap defines the bend between adjacent channels (e.g., the first channel 170A and the second channel 170B). The interior seal 166 can be formed in the same manner as the peripheral seal 164.

Figure 6:
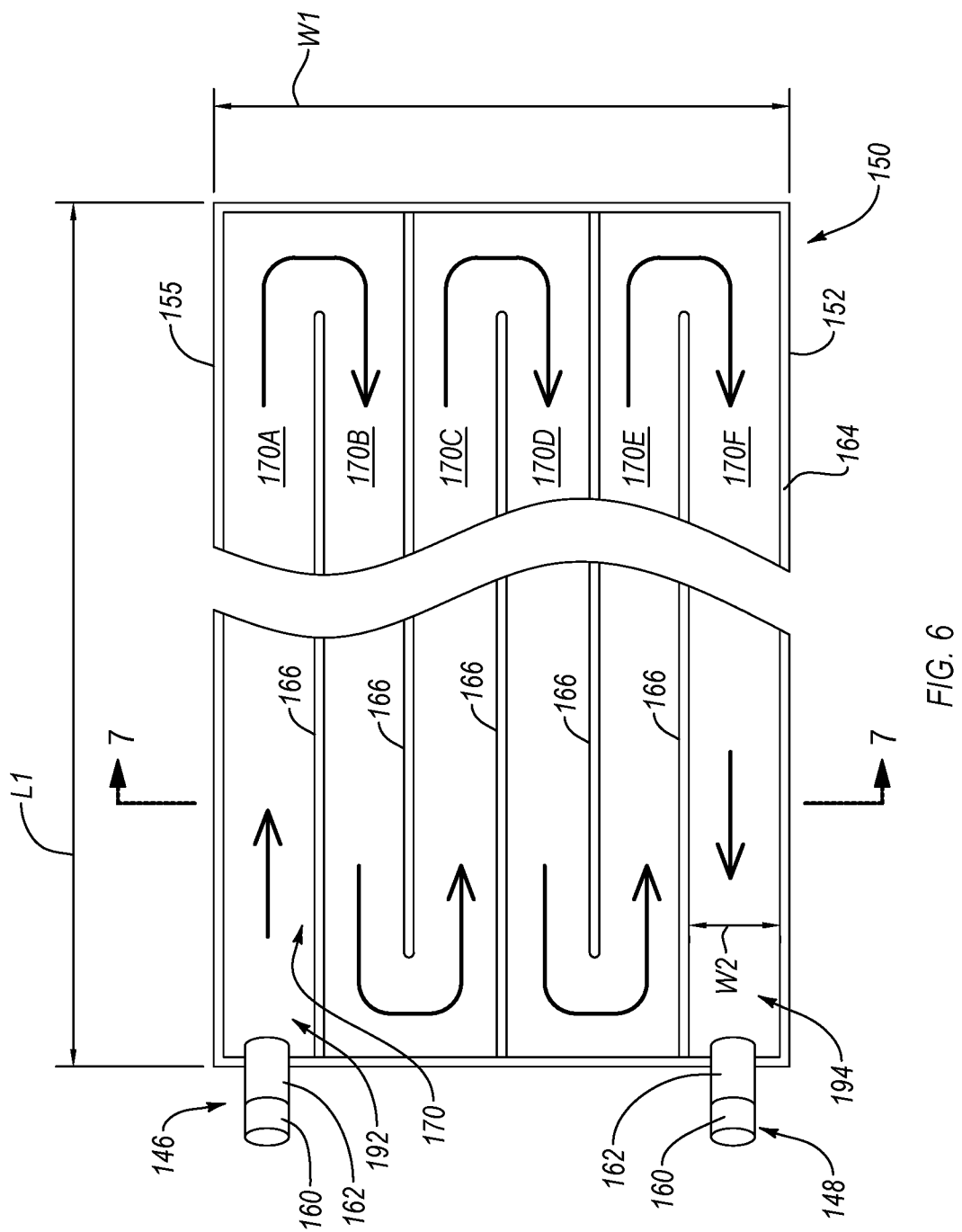
FIG. 6 is a part perspective view and part top plan view of a heat source and a heat exchange system, according to one or more examples of the present disclosure.
Figure 7:
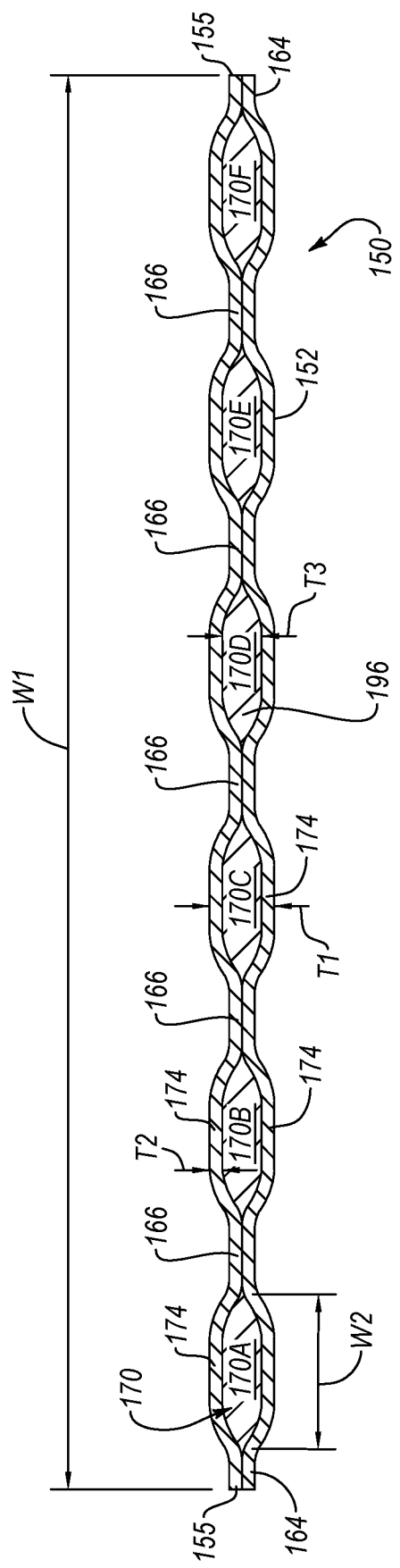
FIG. 7 is a cross-sectional side elevation view of a heat exchanger of the heat exchange system of FIG. 6, taken along the line 7-7 of FIG. 6, according to one or more examples of the present disclosure.

As shown in FIG. 4, in some embodiments, the bladder 152 includes a single interior seal 166 that defines and separates two channels and acts to change a direction of the flow of fluid 196 through the bladder 152 one time. However, in other embodiments, such as shown in FIG. 6, the bladder includes a plurality of interior seals 166 that are arranged relative to each other to define and separates more than two channels (e.g., first-sixth channels 170A-F). The plurality of interior seals 166 act to change a direction of the flow of fluid 196 through the bladder 152 a plurality of times. In some implementations, changing the direction of the flow of fluid 196 through the bladder 152 a plurality of times can help to more efficiently transfer heat from the fluid 196 to the overlaying structural component 124. Although the interior seal 166 of the bladder 152 is linear in the illustrated implementations, in some implementations, the interior seal 166 can be curved to introduce curved channels. In certain examples, the bladder 152 may configure the channels of the fluid flow conduit 170 to utilize capillary action principles to enhance the flowability of the fluid 196 and heat transfer capability of the bladder 152.

The bladder 152 can have any of various outer peripheral shapes. In the illustrated embodiments, the bladder 152 has a rectangular shape with a width W1 of the bladder 152 being greater than the length L1 of the bladder 152. In this manner, the bladder 152 is elongated in its lengthwise direction. According to other embodiments, the bladder 152 can have other outer peripheral shapes, such as simple shapes (e.g., circular, square, triangular) or complex shapes. The shape of the outer periphery 155 of the bladder 152 may complement the shape of the structural component 124 to which the bladder 152 is coupled.

The bladder 152 is elastically or non-elastically flexible in some implementations. Accordingly, the bladder 152 can be flexed into shape in order to complement any number of differently shaped or sized structural components 124. In this manner, in one implementation, one bladder 152 can be used for any of multiple variously shaped structural components 124. Additionally, a flexible bladder 152 facilitates installation of the bladder 152. In particular, being able to flex the bladder 152 can help to retrofit the bladder 152 into an existing structural component 124. Furthermore, a flexible bladder 152 promotes conformity of the flexible bladder 152 to an overlaying surface of the structural component 124, which improves heat transfer.

The non-elastic or elastic flexibility of the bladder 152 is provided by the type of material from which the thin-walled sheets 174 of the bladder 152 is made. In other words, the thin-walled sheets 174 can be made of a non-elastically or elastically flexible material. In one implementation, the thin-walled sheets 174 are made of a metallic material, such as aluminum, copper, and the like. However, in other implementations, the thin-walled sheets 174 are made of a non-metallic material, such as plastic (e.g., Mylar), a fiber-reinforced polymer, or a carbon-based material, such as carbon nano-tubes or graphite sheets. However, the thin-walled sheets 174 can be made of a combination of plastic and metallic materials, such as a metallized polyester. The material of the thin-walled sheets 174 is substantially non-porous so as to prevent the passage of the fluid 196 through the sheets. Moreover, the type of material used for the thin-walled sheets 174 can be dependent on the area of the structural component 124 to be heated (e.g., the smaller the area, the more thermally conductive the material). For this reason, the relatively large area of the leading edge 122 of the wing 114, in effect acting as a heat sink, allows the bladder 152 to be made of relatively less thermally conductive materials, which may help to reduce costs and complexity.

The thin-walled sheets 174 are thin, relative to a width and length of the sheets. For example, in one implementation, the thin-walled sheets 174 can be a plastic or metallic foil. In some examples, the thickness of the thin-walled sheets 174 is selected to provide the thinnest sheet possible to promote a reduction in the weight of the bladder 152, a shorter heat conduction path to a convective surface, and increasing surface available for conduction heat transfer through the sheet to the convective surface in contact with ambient air. According to some implementations, the thickness T2 of each thin-walled sheet 174 is no more than 3.175 mm. In one implementation, the thickness is no more than 1.27 mm.

The thin-walled nature of the sheets 174 promotes a correspondingly thin fluid flow conduit 170. In other words, the fluid flow conduit 170 has a thickness T3 that is less than a width W2 of the fluid flow conduit 170 along a length of the fluid flow conduit 170. Described generally, a cross-sectional shape of the fluid flow conduit 170, along a plane perpendicular to a fluid flow direction through the fluid flow conduit 170, is elongated along the width W2. The thin elongate shape of the fluid flow conduit 170 results in a thin elongate volumetric flow shape of the fluid 196 through the fluid flow conduit 170. Such a shape promotes the ability to locate the bladder 152, and provide heat transfer functionality, in tight spaces or under tight spatial constraints. Furthermore, the thin-walled and flexible nature of the bladder 152 helps to achieve intimate contact with the inside surface of the leading edge 122 of the wing 114, which reduces thermal resistance and promotes heat transfer. In certain implementations, thermal resistance between the bladder 152 and the inside surface of the leading edge 122 of the wing 114 can be decreased by interposing thermal grease or lubricant between the bladder 152 and the inside surface, which helps to fill voids that may exist between the bladder 152 and the inside surface. The addition of thermal grease or lubricant may also help to reduce wrinkles or bunching of the bladder 152 during installation of the bladder 152. Additionally, the thin elongate shape of the fluid flow conduit 170 increases the heat transfer efficiency of the bladder 152 relative to thicker and non-elongate conduits. In some implementations, a ratio of the cross-sectional area of fluid 196 in the fluid flow conduit 170 at a given point to the cross-sectional area of the material of the bladder 152 defining the flow conduit 170 at that point is between 10 and 100.

The thickness T1 of the bladder 152 (see, e.g., FIG. 5) is equal to the sum of two times the thickness T2 of the thin-walled sheets 174 and the thickness T3 of the fluid flow conduit 170. Accordingly, the relatively thin thin-walled sheets 174 and fluid flow conduit 170 results in a relatively thin bladder 152.

The fluid transmission system 140 is operable to transfer fluid 196 from the heat source 130 to the heat exchanger 150 and from the heat exchanger 150 to the heat source 130. In other words, the fluid transmission system 140 cycles the fluid 196 between the heat source 130 and the heat exchanger 150 to promote the transfer of heat from the heat source 130 to the heat exchanger 150. According to one embodiment shown in FIGS. 3 and 4, the fluid transmission system 140 includes a first fluid line 142 and a second fluid line 144. The first fluid line 142 is coupled to and extends between the heat source 130 and the inlet 190 of the bladder 152. Generally, the first fluid line 142 is coupled (e.g., fixedly coupled) in fluid receiving communication with the heat source 130 and coupled in fluid providing communication with the inlet 190 of the bladder 152. The second fluid line 144 is coupled to and extends between the heat source 130 and the outlet 192 of the bladder 152. Generally, the second fluid line 144 is coupled (e.g., fixedly coupled) in fluid providing communication with the heat source 130 and coupled in fluid receiving communication with the outlet 192 of the bladder 152. Each of the first fluid line 142 and the second fluid line 144 can be any of various fluid transmission tubes or conduits known in the art. Although not shown, the fluid transmission system 140 may include fluid lines integrated into the heat source 130 so as to promote efficient transfer of heat from the heat source 130 to the fluid 196 in the integrated fluid lines.

The fluid transmission system 140 further includes a flow regulation device 136, which can include a fluid pump 137. The flow regulation device 136 is operable to control the volumetric flow rate of the fluid 196 through the fluid flow conduit 170. Selective control of the operation of the flow regulation device 136 can be provided by an electronic controller 110 of the heat exchange system 138. For example, based on one or more inputs, the electronic controller 110 controls the volumetric flow rate of the fluid 196 through the fluid transmission system 140 to effectuate a desired heat transfer rate from the heat exchanger 150. The inputs may include one or more of heat output of the heat source 130, speed of the aircraft 100, atmospheric conditions (e.g., humidity, air temperature, pressure, etc.), virtual or physical detection of the likelihood of ice formation on the wings 114, stored electrical energy, etc.

In some implementation, the flow regulation device 136 is a soft valve constructed without hard components. The soft valve includes an orifice with an area that is dynamically-influenced by compressing on the fluid flow path. Such a soft valve could be located in the bladder 152 or in the fluid transmission system 140. The biomimicry form of a soft valve of this nature may help to promote reliability and a reduction in the mass and manufacturing cost of the exchange system 138.

Figure 3:
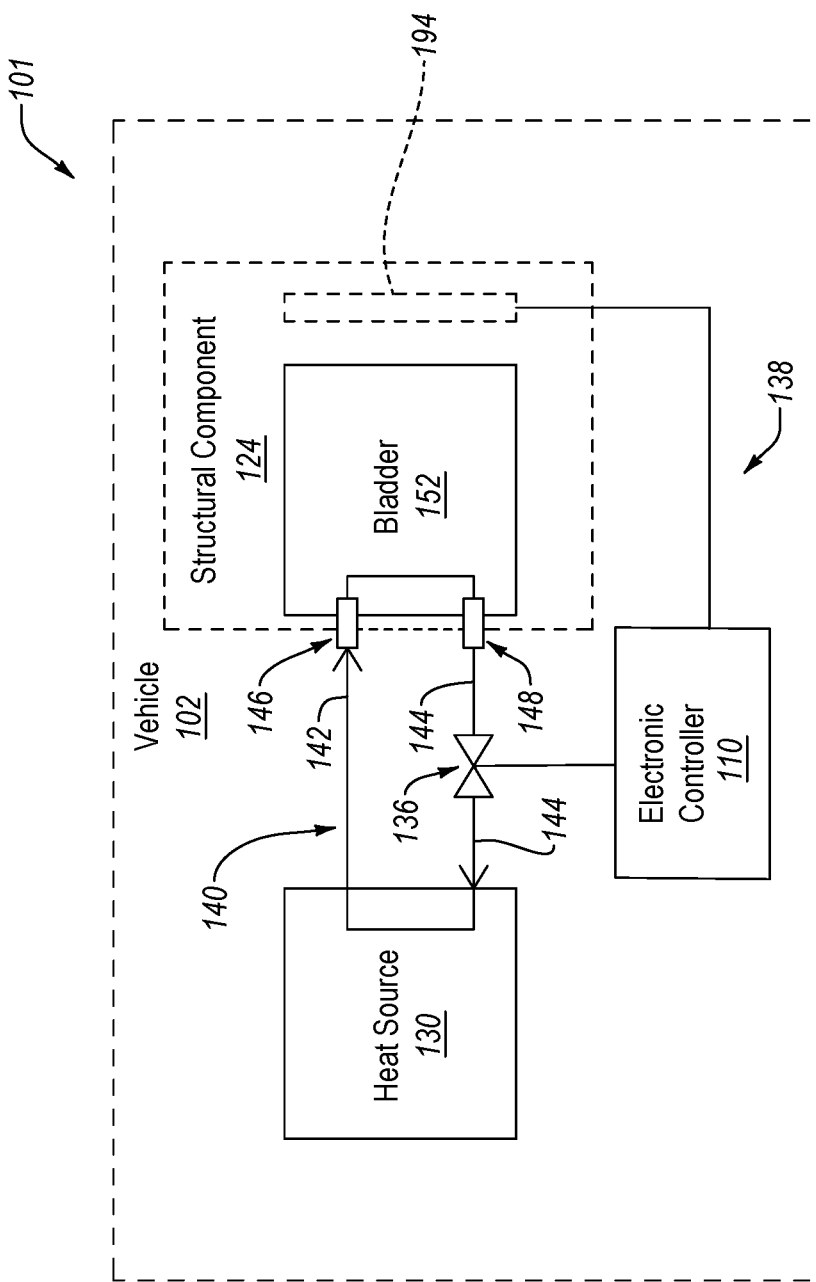
FIG. 3 is a schematic block diagram of a system for dissipating heat, according to one or more examples of the present disclosure.

In some embodiments, referring to FIG. 3, the fluid transmission system 140 additionally includes an inlet connection system 146 and an outlet connection system 148. The inlet connection system 146 can include any of various connectors that help facilitate a sealed fluidic connection between the first fluid line 142 and the inlet 190 of the bladder 152. Similarly, the outlet connection system 148 can include any of various connectors that help facilitate a sealed fluidic connection between the second fluid line 144 and the outlet 192 of the bladder 152. In one particular example shown in FIG. 4, the inlet connection system 146 and the outlet connection system 148 each includes a first fitting 160 and a second fitting 162. The first fitting 160 is selectively disconnectable from the second fitting 162 for quick and easy connection and disconnection of the first fitting 160 and the second fitting 162. For example, the first fitting 160 and the second fitting 160 can be Luer-Lock standard fittings. The first fitting 160 of the inlet connection system 146 is coupled (e.g., non-removably fixed directly) to the bladder 152 at the inlet 190 and the second fitting 162 of the inlet connection system 146 is coupled (e.g., non-removably) to the first fluid line 142. In contrast, the first fitting 160 of the outlet connection system 148 is coupled (e.g., non-removably fixed directly) to the bladder 152 at the outlet 192 and the second fitting 162 of the outlet connection system 146 is coupled (e.g., non-removably) to the second fluid line 142.

Figure 12:
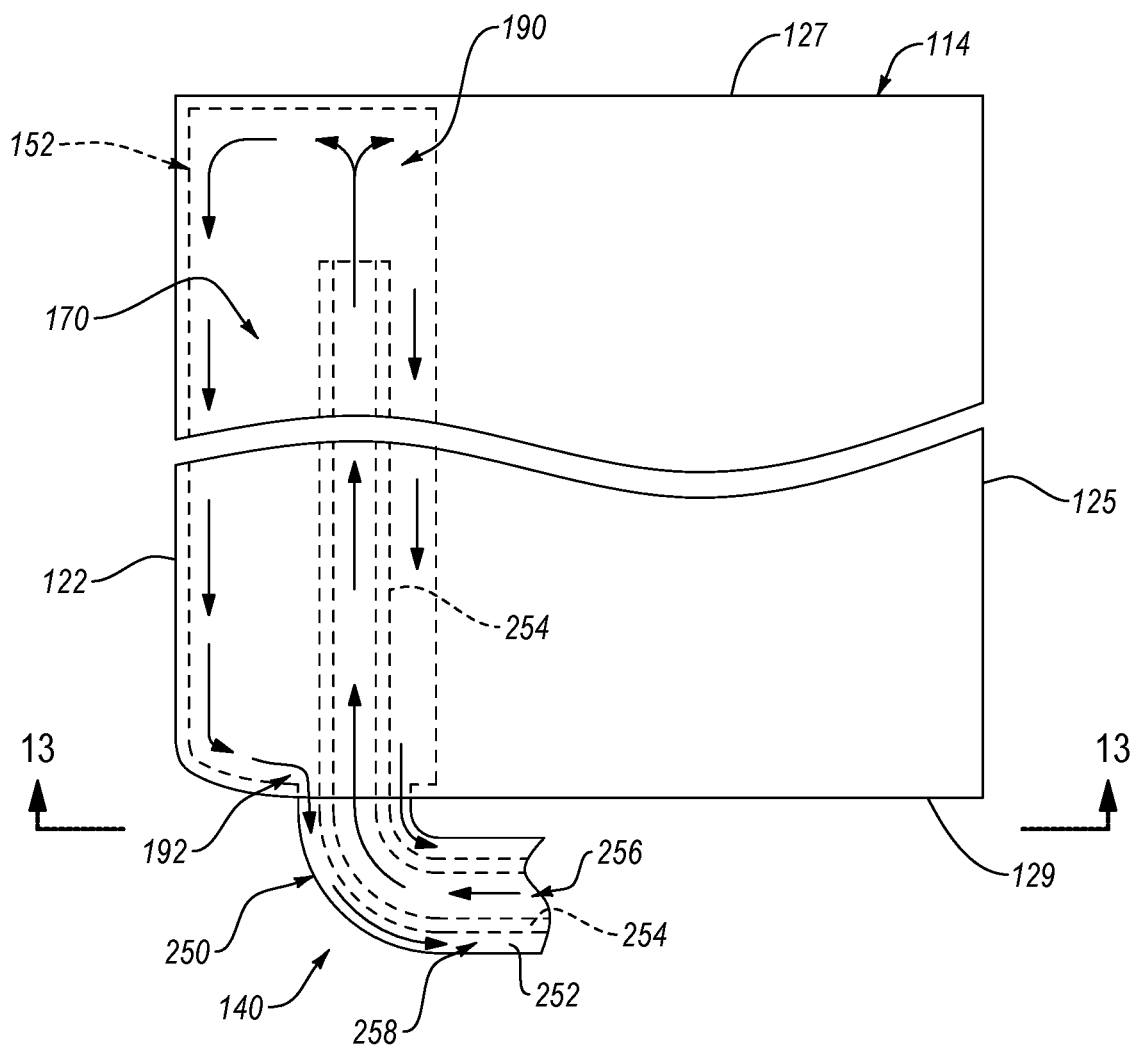
FIG. 12 is a top plan view of a wing of an aircraft, according to one or more examples of the present disclosure.
Figure 13:
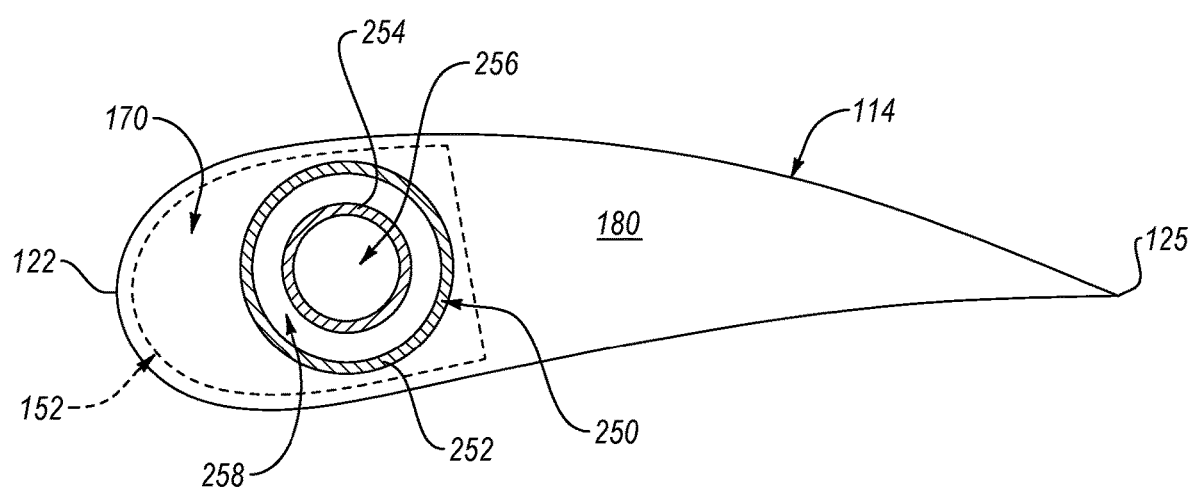
FIG. 13 is a cross-sectional side elevation view of the wing of the aircraft, according to one or more examples of the present disclosure.

Referring to FIGS. 12 and 13, in some embodiments, the fluid transmission system 140 includes a single coaxial connection 250 that is configured to transfer the fluid 196 into the bladder 152 and, after the fluid 196 has circulated through the bladder 152, out of the bladder 152. The bladder 152 is coupled to the inside surface of the leading edge 122 of the wing 114. However, instead of the fluid conduit 170 being divided into an inlet channel and an outlet channel, the fluid conduit 170 of the bladder 152 of FIGS. 12 and 13 acts only as an outlet channel. Moreover, as shown in FIG. 13, the cross-sectional area of the fluid conduit 170 matches the entire cross-sectional area of the interior cavity 180 of the wing 114 from the top of the wing to the bottom of the wing. The bladder 152 of FIGS. 12 and 13 can be formed of a single thin-walled flexible sheet or multiple thin-walled flexible sheets.

The coaxial connection 250 is coupled to the inboard end 129 of the wing 114 and can be housing within the inboard end 129 of the wing 114, within a body-wing fairing, and/or within the body 112 of the aircraft 100. The coaxial connection 250 has a tube-in-tube configuration. In particular, the coaxial connection 250 includes an outer tube 252 and an inner tube 254. The inner tube 254 is coaxial with the outer tube 252. Moreover, the inner tube 254 is located within and radially spaced apart from the outer tube 252. The inner tube 254 defines an inlet channel 256 in fluid receiving communication with the heat source 130 and fluid providing communication with the bladder 152. Defined between the inner tube 254 and the outer tube 252 is an outlet channel 258 in fluid receiving communication with the bladder 152 and fluid providing communication with the heat source 130. The outlet channel 258 has an annular shape and is concentric with the inlet channel 256.

As shown in FIG. 12, the inner tube 254, and thus the inlet channel 256, extends from the inboard end 129 of the wing 114, through the fluid conduit 170, to approximately the outboard end 127. At the outboard end 127, the bladder 152 is sealed and the inlet channel 256 opens to the fluid conduit 170 of the bladder 152. In contrast, the outlet channel 258 opens to the fluid conduit 170 of the bladder 152 at the inboard end 129 of the wing 114. In operation, the fluid 196 flows through the coaxial connection 250 and the bladder 152 as shown by directional arrows in FIG. 12. More specifically, the fluid 196 flows from the "hot side" of the heat source 130, through the inlet channel 256, and into the fluid conduit 170 of the bladder 152 at the outboard end 127 of the wing 114. Of course, if the bladder 152 terminates at some intermediate location away from the outboard end 127, the inner tube 254 and the inlet channel 256 may also terminate at the intermediate location and the fluid 196 will flow into the fluid conduit 170 of the bladder 152 at the intermediate location. After exiting the inlet channel 256 the fluid 196 flows directly or circuitously, depending on the configuration of the fluid conduit 170, through the fluid conduit 170 from the outboard end 127 of the wing 114 to the inboard end 129 of the wing 114. While flowing through the fluid conduit 170 of the bladder 152, heat in the fluid 196 is transferred to the leading edge 122 of the wing 114. After flowing through the fluid conduit 170 of the bladder 152, the fluid 196 exits the fluid conduit 170 and enters the outlet channel 258. From the outlet channel 258, the fluid 196 flows back to the "cold side" of the heat source 130.

In some implementations, the wings 114 are selectively removable from the body 112, such as for storage purposes. In such and implementation, selective disconnection of the first fitting 160 and the second fitting 162 allows the wing 114 to be removed from the body 112 without having to remove the bladder 152 from the wing 114.

Referring to FIG. 8, in one embodiment, the bladder 152 is coupled to the wing 114 and located interiorly of the outer skin 183. Accordingly, the bladder 152 does not affect the aerodynamic drag of the wing 114. In operation, as shown by directional arrows H, heat in the fluid 196 passing through the fluid conduit 170 is transferred through the bladder 152 (e.g., the thin-walled sheet 174 of the bladder 152 between the fluid conduit 170 and the outer skin 183) and the outer skin 183 to the colder atmosphere. In this manner, heat from the heat source 130 is dissipated away from the aircraft 100 via the bladder 152 and the wing 114. In certain implementations, the bladder 152 abuts the interior surface 182 of the leading edge 122 of the outer skin 183 to promote direct surface contact between the bladder 152 and the leading edge 122 and efficient heat transfer between the bladder 152 and the leading edge 122. In this manner, in some implementations, the outer skin 183 in effect functions as part of or an extension of the heat exchanger 150.

As the leading edge 122 of the outer skin 183 is contoured (e.g., curved), the bladder 152 also is contoured to complement the contour or curvature of the leading edge 122 of the wing 114. In some implementations, the bladder 152 is adhered to the interior surface 182 of the leading edge 122, such as with thermal grease, thermal tape, or other thermally conductive adhesive. As indicated, the bladder 152 can be sized to have a width W1 sufficient to span the entire leading edge 122 of the wing 114. In this manner, heat from the bladder 152 can be transferred to the area of the wing 114 most susceptible to ice formation. Accordingly, heat from the heat source 130, which is conventionally wastefully dumped to atmosphere, is in effect reallocated to serve the additional purpose of heating the leading edges 122 of the wing 114 so as to mitigate the formation of ice on the leading edges 122 or melt ice already formed on the leading edges 122.

Referring to FIG. 9, because of the relatively thin profile of the bladder 152, in some embodiments, the bladder 152 can be sandwiched between layers of a laminated stack during the stack formation or layup process. For example, the bladder 152 is sandwiched between the layer 184 and the layer 186 of the laminate stack forming the outer skin 183 of the wing 114. The bladder 152 is bonded or adhered to the adjacent layers using any of various adhesives, epoxies, resins, and the like.

Figure 10:
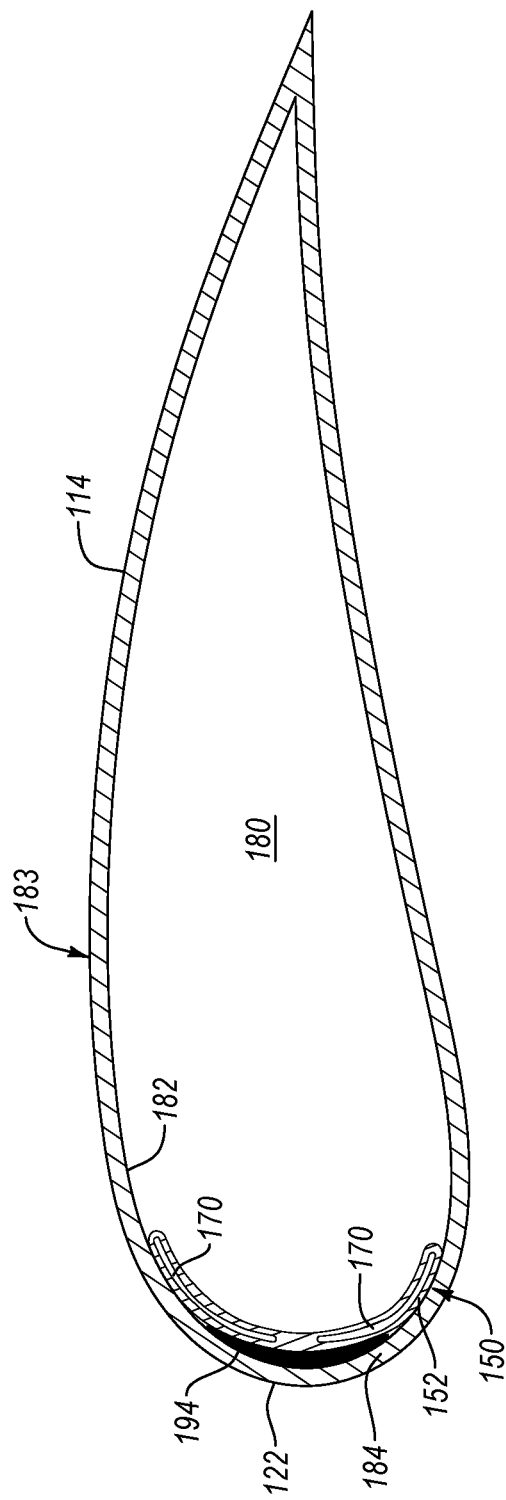
FIG. 10 is a cross-sectional side elevation view of a wing of the aircraft of FIG. 2, taken along the line 8-8 of FIG. 2, according to one or more examples of the present disclosure.

As shown in FIG. 10, according to some embodiments, the aircraft 100 may further include a resistive circuit 194, in addition to the bladder 152, at the leading edge 122 of the wing 114. The resistive circuit 194 can be located between the bladder 152 and the outer skin 183 of the wing 114. In some implementations, the resistive circuit 194 includes high-resistance electrical wire or an electrical wire with one or more resistors. Referring to FIG. 3, the resistive circuit 194 can be controllable by the electronic controller 110 to generate heat. Generally, as an electrical current is passed through the resistive circuit 194, the built-in electrical resistance of the resistive circuit 194 converts the electrical energy to heat energy. The heat generated by the resistive circuit 194 is transmitted to the leading edge 122 of the wing 114, which helps to heat the leading edge 122 to prevent the formation of ice thereon or melt ice already formed on the leading edge 122.

In some implementations, the responsiveness of the resistive circuit 194 is faster than that of the bladder 152. For example, it may take more time on start-up for the bladder 152 to sufficiently heat the leading edge 122 than for the resistive circuit 194 to generate sufficiently heat the leading edge 122. Accordingly, based on whether extra thermal load on the wing 114 is needed, the electronic controller 110 may be configured to activate the resistive circuit 194 for relatively rapid generation of heat and heating of the leading edge 122 and deactivate the resistive circuit 194 after the heat transfer performance of the bladder 152 reaches desired levels.

Figure 11:
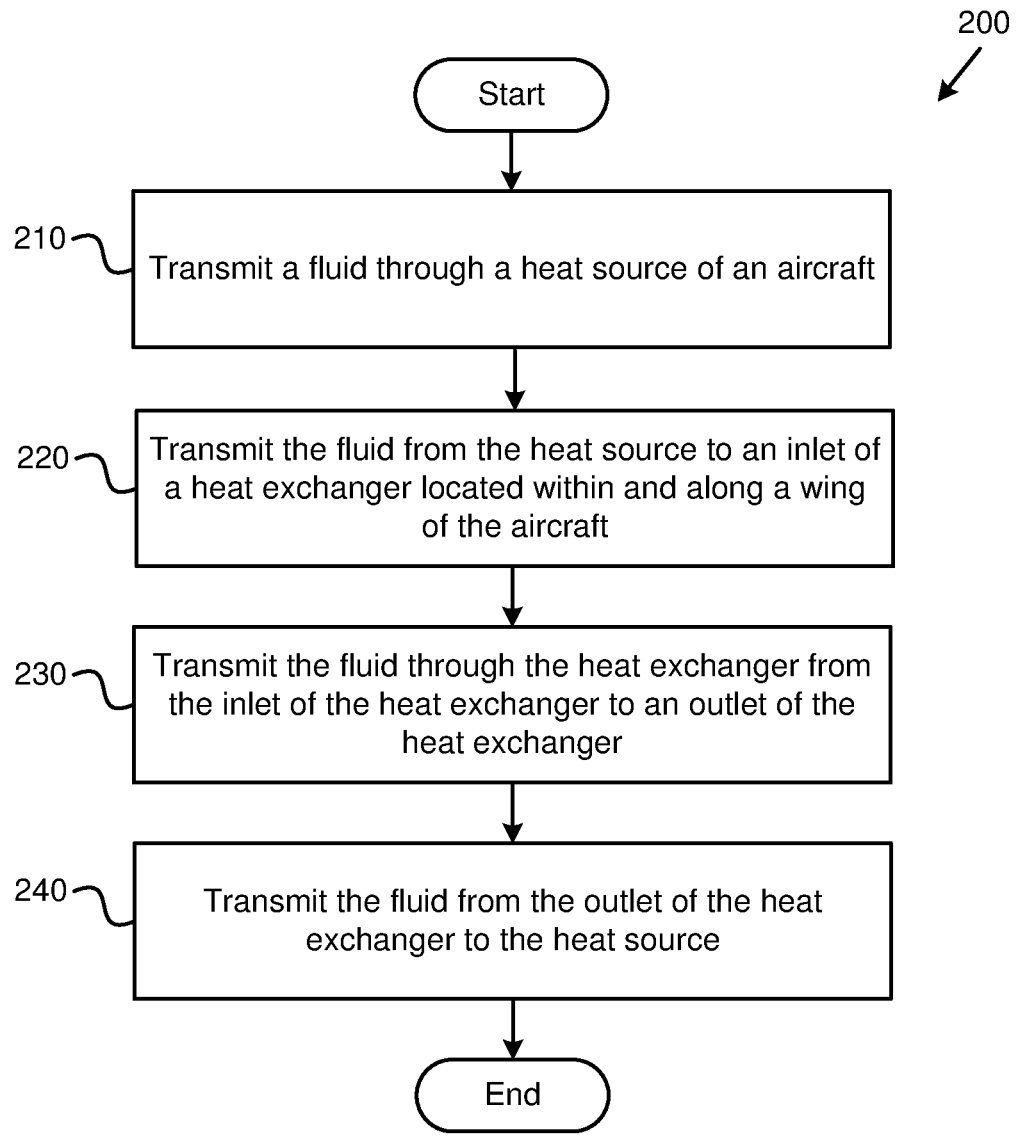
FIG. 11 is a schematic flow diagram of a method of mitigating ice formation on a wing of an aircraft, according to one or more examples of the present disclosure.

According to one embodiment shown in FIG. 11, a method 200 of mitigating ice formation on a wing 114 of an aircraft 100 includes transmitting a fluid 196 through a heat source 130 of the aircraft 100 at 210. The method 200 further includes transmitting the fluid 196 from the heat source 130 to an inlet 190 of a heat exchanger 150 located within and along the wing 114 at 220. The method 200 additionally includes transmitting the fluid 196 through the heat exchanger 150 from the inlet 190 of the heat exchanger 150 to an outlet 192 of the heat exchanger 150 at 230. The method 200 also includes transmitting the fluid 196 from the outlet 192 of the heat exchanger 150 to the heat source 130 at 240. The temperature of the fluid 196 entering the heat exchanger 150 is higher than the temperature of the fluid 196 exiting the heat exchanger 150 due to the dissipation of heat from the fluid 196 to the wing 114 as the fluid is transmitted through the heat exchanger 150. The temperature of the fluid 196 ranges between 25° C. and 150° C. in certain implementations. In some implementations, prior to or concurrently with transmitting the fluid 196 as defined in steps 210-240, the method 200 includes transmitting electrical power through a resistive circuit 194 located within and along the wing 114 to heat the wing 114.

The volumetric flow rate at which the fluid 196 is transmitted in steps 210-240 of the method 200 is regulated by a flow regulation device 136, which is selectively controlled by an electronic controller 110, based on various factors. In one implementation, one factor includes a desired transfer rate of heat to the wing 114, which can depend on the likelihood of ice formation on the wing 114 and/or the amount of heat being generated by the heat source 130 and a desired operational temperature of the heat source 130. For example, the more conducive the atmospheric conditions are to ice formation on the wing 114 or the more heat that need to be transferred from the heat source 130 to maintain a desired operation temperature of the heat source 130, the higher the desired heat transfer rate. Based on the desired transfer rate of heat to the wing 114, the volumetric flow rate at which the fluid 196 is transmitted is regulated, in view of external factors, to achieve the desired heat transfer rate. For example, for a given desired heat transfer rate, the colder the atmospheric temperature, the slower the speed of the aircraft 100, and/or the higher the heat output of the heat source 130, the higher the volumetric flow rate of the fluid 196 to achieve the desired heat transfer rate. In contrast, as an example, for a given desired heat transfer rate, the warmer the atmospheric temperature, the faster the speed of the aircraft 100, and/or the lower the heat output of the heat source 130, the lower the volumetric flow rate of the fluid 196 to achieve the desired heat transfer rate.

Although the vehicle and structural component are described herein with specific reference to aircraft and wings, in other embodiments, the vehicle can be a vehicle other than an aircraft and the structural component can be a structural component other than a wing without departing from the essence of the present disclosure. For example, in the context of aircraft, the bladder 152 can be integrated into a leading edge of the stabilizers of the aircraft 100 or into one or more portions of the body 112. According to one implementation, the bladder 152 can be located above the heat source 130 to transfer some heat from the heat source to the bladder 152 via convection, which may help reduce the quantity of components necessary for functionality of the bladder 152 thus increasing reliability and reducing mass. As another example, in the context of a water vessel, the bladder 152 can be integrated into the hull of the water vessel to dissipate heat away from the hull to the water.

In the above description, certain terms may be used such as "up," "down," "upper," "lower," "horizontal," "vertical," "left," "right," "over," "under" and the like. These terms are used, where applicable, to provide some clarity of description when dealing with relative relationships. But, these terms are not intended to imply absolute relationships, positions, and/or orientations. For example, with respect to an object, an "upper" surface can become a "lower" surface simply by turning the object over. Nevertheless, it is still the same object. Further, the terms "including," "comprising," "having," and variations thereof mean "including but not limited to" unless expressly specified otherwise. An enumerated listing of items does not imply that any or all of the items are mutually exclusive and/or mutually inclusive, unless expressly specified otherwise. The terms "a," "an," and "the" also refer to "one or more" unless expressly specified otherwise. Further, the term "plurality" can be defined as "at least two." Moreover, unless otherwise noted, as defined herein a plurality of particular features does not necessarily mean every particular feature of an entire set or class of the particular features.

Additionally, instances in this specification where one element is "coupled" to another element can include direct and indirect coupling. Direct coupling can be defined as one element coupled to and in some contact with another element. Indirect coupling can be defined as coupling between two elements not in direct contact with each other, but having one or more additional elements between the coupled elements. Further, as used herein, securing one element to another element can include direct securing and indirect securing. Additionally, as used herein, "adjacent" does not necessarily denote contact. For example, one element can be adjacent another element without being in contact with that element.

As used herein, the phrase "at least one of", when used with a list of items, means different combinations of one or more of the listed items may be used and only one of the items in the list may be needed. The item may be a particular object, thing, or category. In other words, "at least one of" means any combination of items or number of items may be used from the list, but not all of the items in the list may be required. For example, "at least one of item A, item B, and item C" may mean item A; item A and item B; item B; item A, item B, and item C; or item B and item C. In some cases, "at least one of item A, item B, and item C" may mean, for example, without limitation, two of item A, one of item B, and ten of item C; four of item B and seven of item C; or some other suitable combination.

Unless otherwise indicated, the terms "first," "second," etc. are used herein merely as labels, and are not intended to impose ordinal, positional, or hierarchical requirements on the items to which these terms refer. Moreover, reference to, e.g., a "second" item does not require or preclude the existence of, e.g., a "first" or lower-numbered item, and/or, e.g., a "third" or higher-numbered item.

As used herein, a system, apparatus, structure, article, element, component, or hardware "configured to" perform a specified function is indeed capable of performing the specified function without any alteration, rather than merely having potential to perform the specified function after further modification. In other words, the system, apparatus, structure, article, element, component, or hardware "configured to" perform a specified function is specifically selected, created, implemented, utilized, programmed, and/or designed for the purpose of performing the specified function. As used herein, "configured to" denotes existing characteristics of a system, apparatus, structure, article, element, component, or hardware which enable the system, apparatus, structure, article, element, component, or hardware to perform the specified function without further modification. For purposes of this disclosure, a system, apparatus, structure, article, element, component, or hardware described as being "configured to" perform a particular function may additionally or alternatively be described as being "adapted to" and/or as being "operative to" perform that function.

The schematic flow chart diagrams included herein are generally set forth as logical flow chart diagrams. As such, the depicted order and labeled steps are indicative of one embodiment of the presented method. Other steps and methods may be conceived that are equivalent in function, logic, or effect to one or more steps, or portions thereof, of the illustrated method. Additionally, the format and symbols employed are provided to explain the logical steps of the method and are understood not to limit the scope of the method. Although various arrow types and line types may be employed in the flow chart diagrams, they are understood not to limit the scope of the corresponding method. Indeed, some arrows or other connectors may be used to indicate only the logical flow of the method. For instance, an arrow may indicate a waiting or monitoring period of unspecified duration between enumerated steps of the depicted method. Additionally, the order in which a particular method occurs may or may not strictly adhere to the order of the corresponding steps shown.

The electronic controller and associated modules described in this specification may be implemented as a hardware circuit comprising custom VLSI circuits or gate arrays, off-the-shelf semiconductors such as logic chips, transistors, or other discrete components. The electronic controller may also be implemented in programmable hardware devices such as field programmable gate arrays, programmable array logic, programmable logic devices or the like.

The electronic controller may also be implemented in code and/or software for execution by various types of processors. An identified module of code may, for instance, comprise one or more physical or logical blocks of executable code which may, for instance, be organized as an object, procedure, or function. Nevertheless, the executables of the electronic controller need not be physically located together, but may comprise disparate instructions stored in different locations which, when joined logically together, comprise the electronic controller and achieve the stated purpose for the electronic controller.

Indeed, code of the electronic controller may be a single instruction, or many instructions, and may even be distributed over several different code segments, among different programs, and across several memory devices. Similarly, operational data may be identified and illustrated herein within the electronic controller, and may be embodied in any suitable form and organized within any suitable type of data structure. The operational data may be collected as a single data set, or may be distributed over different locations including over different computer readable storage devices. Where the electronic controller or portions of the electronic controller are implemented in software, the software portions are stored on one or more computer readable storage devices.

Any combination of one or more computer readable medium may be utilized. The computer readable medium may be a computer readable storage medium. The computer readable storage medium may be a storage device storing the code. The storage device may be, for example, but not limited to, an electronic, magnetic, optical, electromagnetic, infrared, holographic, micromechanical, or semiconductor system, apparatus, or device, or any suitable combination of the foregoing.

More specific examples (a non-exhaustive list) of the storage device would include the following: an electrical connection having one or more wires, a portable computer diskette, a hard disk, a random access memory (RAM), a read-only memory (ROM), an erasable programmable read-only memory (EPROM or Flash memory), a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

Code for carrying out operations for embodiments may be written in any combination of one or more programming languages including an object oriented programming language such as Python, Ruby, Java, Smalltalk, C++, or the like, and conventional procedural programming languages, such as the "C" programming language, or the like, and/or machine languages such as assembly languages. The code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

The described features, structures, or characteristics of the embodiments may be combined in any suitable manner. In the above description, numerous specific details are provided, such as examples of programming, software modules, user selections, network transactions, database queries, database structures, hardware modules, hardware circuits, hardware chips, etc., to provide a thorough understanding of embodiments. One skilled in the relevant art will recognize, however, that embodiments may be practiced without one or more of the specific details, or with other methods, components, materials, and so forth. In other instances, well-known structures, materials, or operations are not shown or described in detail to avoid obscuring aspects of an embodiment.

Aspects of the embodiments are described below with reference to schematic flowchart diagrams and/or schematic block diagrams of methods, apparatuses, systems, and program products according to embodiments. It will be understood that each block of the schematic flowchart diagrams and/or schematic block diagrams, and combinations of blocks in the schematic flowchart diagrams and/or schematic block diagrams, can be implemented by code. These code may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the schematic flowchart diagrams and/or schematic block diagrams block or blocks.

The code may also be stored in a storage device that can direct a computer, other programmable data processing apparatus, or other devices to function in a particular manner, such that the instructions stored in the storage device produce an article of manufacture including instructions which implement the function/act specified in the schematic flowchart diagrams and/or schematic block diagrams block or blocks.

The code may also be loaded onto a computer, other programmable data processing apparatus, or other devices to cause a series of operational steps to be performed on the computer, other programmable apparatus or other devices to produce a computer implemented process such that the code which execute on the computer or other programmable apparatus provide processes for implementing the functions/acts specified in the flowchart and/or block diagram block or blocks.

The schematic flowchart diagrams and/or schematic block diagrams in the Figures illustrate the architecture, functionality, and operation of possible implementations of apparatuses, systems, methods and program products according to various embodiments. In this regard, each block in the schematic flowchart diagrams and/or schematic block diagrams may represent a module, segment, or portion of code, which comprises one or more executable instructions of the code for implementing the specified logical function(s).

It should also be noted that, in some alternative implementations, the functions noted in the block may occur out of the order noted in the Figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated Figures.

The present subject matter may be embodied in other specific forms without departing from its spirit or essential characteristics. The described embodiments are to be considered in all respects only as illustrative and not restrictive. All changes which come within the meaning and range of equivalency of the claims are to be embraced within their scope.

What is claimed is:

1. An aircraft, comprising:
    a body;
    wings coupled to the body, each of the wings comprising a leading edge defined by an exterior surface of the wing that is opposite an interior surface of the wing;
    a heat source fixed to the body;
    a bladder coupled to each one of the wings and comprising opposing thin-walled sheets and a fluid flow conduit defined between the opposing thin-walled sheets, wherein the fluid flow conduit comprises an inlet and an outlet, and wherein each one of the bladders is located inside and adjacent the leading edge of a corresponding one of the wings;
    a first fluid line coupled to the heat source and the inlet of the bladder;
    a second fluid line coupled to the heat source and the outlet of the bladder; and
    fluid flowable through the first fluid line from the heat source to the inlet, from the inlet through the fluid flow conduit to the outlet, and through the second fluid line from the outlet to the heat source.

2. The aircraft according to claim 1, wherein a cross-sectional shape of the fluid flow conduit, along a plane perpendicular to a fluid flow direction through the fluid flow conduit, is elongated.

3. The aircraft according to claim 1, wherein each sheet of the opposing thin-walled sheets is made of a metallic or plastic foil.

4. The aircraft according to claim 1, wherein:
    the bladder further comprises a peripheral seal, about an outer periphery of the opposing thin-walled sheets, and at least one interior seal, only partially traversing the opposing thin-walled sheets interiorly of the peripheral seal;
    the peripheral seal and the at least one interior seal each comprises sealingly intercoupled portions of the opposing thin-walled sheets; and
    the fluid flow conduit is defined between the peripheral seal and the at least one interior seal.

5. The aircraft according to claim 4, wherein:
    the bladder comprises a plurality of interior seals; and
    the plurality of interior seals are arranged to change direction of the fluid flow conduit a plurality of times.

6. The aircraft according to claim 1, further comprising an inlet connection system and an outlet connection system, wherein:
    each of the inlet connection system and the outlet connection system comprises a first fitting and a second fitting, the first fitting being selectively disconnectable from the second fitting;
    the first fitting of the inlet connection system is coupled to the bladder at the inlet and the second fitting of the inlet connection system is coupled to the first fluid line; and
    the first fitting of the outlet connection system is coupled to the bladder at the outlet and the second fitting of the outlet connection system is coupled to the second fluid line.

7. The aircraft according to claim 1, wherein the heat source comprises a fuel cell stack.

8. An aircraft, comprising:
    a body;
    wings coupled to the body and each comprising a leading edge defined by an exterior surface of the wing that is opposite an interior surface of the wing;
    a heat source fixed to the body;
    a heat exchanger at the leading edge of each of the wings; and
    a fluid transmission system, comprising a first fluid line and a second fluid line, coupled to the heat source and the heat exchanger, wherein the fluid transmission system is operable to transfer fluid from the heat source to the heat exchanger and from the heat exchanger to the heat source;
    wherein:
        the heat exchanger comprises a bladder coupled to a corresponding one of the wings and comprising opposing thin-walled sheets and a fluid flow conduit defined between the opposing thin-walled sheets;
        the fluid flow conduit comprises an inlet, coupled to the first fluid line, and an outlet, coupled to the second fluid line, wherein the bladder of the heat exchanger is located inside and adjacent the leading edge of the corresponding one of the wings; and
        fluid is flowable through the first fluid line from the heat source to the inlet, from the inlet through the fluid flow conduit to the outlet, and through the second fluid line from the outlet to the heat source.

9. The aircraft according to claim 8, wherein the heat exchanger is elongated in a spanwise direction along the leading edge of the wing.

10. The aircraft according to claim 8, wherein the heat exchanger is flexible.

11. The aircraft according to claim 8, wherein the heat exchanger is contoured to complement a contour of the leading edge of the wing.

12. The aircraft according to claim 8, wherein:
    each wing comprises an outer skin defining a profile of the wing;
    the outer skin comprises multiple layers; and
    the heat exchanger is sandwiched between the multiple layers.

13. The aircraft according to claim 8, wherein:
    the heat source is fixed to the body;
    the wings are selectively removable from the body;
    each of the first fluid line and the second fluid line is fixedly coupled to the heat source;
    the fluid transmission system further comprises an inlet connection system and an outlet connection system each comprising a first fitting and a second fitting, the first fitting being selectively disconnectable from the second fitting;
    the first fitting is non-removably fixed to the heat exchanger; and
    the second fitting is non-removably fixed to a corresponding one of the first fluid line and the second fluid line.

14. The aircraft according to claim 8, wherein the heat source comprises a fuel cell stack.

15. The aircraft according to claim 8, wherein:
    the fluid is flowable through the fluid flow conduit in a fluid flow direction; and
    a cross-sectional shape, along a plane perpendicular to the fluid flow direction, of the fluid flow conduit is elongate.

16. The aircraft according to claim 8, wherein:
each of the wings extends from an inboard end to an outboard end;
the fluid transmission system comprises inner tubes, each comprising an inlet channel and each extending through the fluid flow conduit of a corresponding one of the bladders in a direction from the inboard end to the outboard end of a corresponding one of the wings; and
the fluid is transferred from the heat source to the fluid flow conduit of each bladder through the inlet channel of a corresponding one of the inner tubes.

17. The aircraft according to claim 16, wherein:
the fluid transmission system further comprises outer tubes each located at the inboard end of a corresponding one of the wings;
each outer tube is coaxial with a corresponding one of the inner tubes;
each outer tube defines an annular outlet channel, defined between the outer tube and a corresponding one of the inner tubes; and
the fluid is transferred from the fluid flow conduit of each bladder to the heat source through a corresponding one of the annular outlet channels.

18. The aircraft according to claim 16, wherein the fluid flow conduit of each bladder matches the entire cross-sectional area of a corresponding one of the wings from a top of the wing to a bottom of the wing.

19. An aircraft, comprising:
a body;
wings coupled to the body and each comprising a leading edge;
a heat source;
a heat exchanger at the leading edge of each of the wings; and
a fluid transmission system, comprising a first fluid line and a second fluid line, coupled to the heat source and the heat exchanger, wherein the fluid transmission system is operable to transfer fluid from the heat source to the heat exchanger and from the heat exchanger to the heat source;
wherein:
the heat exchanger comprises a bladder comprising opposing thin-walled sheets and a fluid flow conduit defined between the opposing thin-walled sheets;
the fluid flow conduit comprises an inlet, coupled to the first fluid line, and an outlet, coupled to the second fluid line;
fluid is flowable through the first fluid line from the heat source to the inlet, from the inlet through the fluid flow conduit to the outlet, and through the second fluid line from the outlet to the heat source;
the heat source is fixed to the body;
the wings are selectively removable from the body;
each of the first fluid line and the second fluid line is fixedly coupled to the heat source;
the fluid transmission system further comprises an inlet connection system and an outlet connection system each comprising a first fitting and a second fitting, the first fitting being selectively disconnectable from the second fitting;
the first fitting is non-removably fixed to the heat exchanger; and
the second fitting is non-removably fixed to a corresponding one of the first fluid line and the second fluid line.

20. The aircraft according to claim 1, wherein:
a cross-sectional shape of the fluid flow conduit, along a plane perpendicular to a fluid flow direction through the fluid flow conduit, is elongated;
each sheet of the opposing thin-walled sheets is made of a metallic or plastic foil;
the bladder is elongated in a spanwise direction along the leading edge of the wing;
the bladder is flexible; and
the bladder is contoured to complement a contour of the leading edge of the wing.

* * * * *